(12) United States Patent
Kyoda et al.

(10) Patent No.: US 6,620,997 B2
(45) Date of Patent: *Sep. 16, 2003

(54) PHOTOELECTRIC CONVERSION DEVICE

(75) Inventors: Takeshi Kyoda, Yokaichi (JP); Shin Sugawara, Yokaichi (JP); Hisao Arimune, Yokaichi (JP); Nobuyuki Kitahara, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/046,017

(22) Filed: Oct. 29, 2001

(65) Prior Publication Data

US 2002/0134420 A1 Sep. 26, 2002

(30) Foreign Application Priority Data

| Oct. 30, 2000 | (JP) | ........................................ | 2000-331415 |
| Nov. 29, 2000 | (JP) | ........................................ | 2000-362019 |
| Jan. 29, 2001 | (JP) | ........................................ | 2001-020625 |
| Jan. 29, 2001 | (JP) | ........................................ | 2001-020626 |

(51) Int. Cl.$^7$ .................... H01L 31/0352; H01L 31/04
(52) U.S. Cl. ................. 136/250; 136/261; 136/251; 136/256; 257/431; 257/461; 257/465; 438/63
(58) Field of Search ............................ 136/250, 261, 136/251, 256; 257/431, 461, 465; 438/63

(56) References Cited

U.S. PATENT DOCUMENTS

| 4,514,580 | A | | 4/1985 | Bartlett ........................ 136/250 |
| 4,947,219 | A | * | 8/1990 | Boehm ........................ 257/471 |
| 6,437,234 | B1 | * | 8/2002 | Kyoda et al. ................ 136/250 |
| 2002/0023674 | A1 | * | 2/2002 | Sugawara et al. ........... 136/243 |
| 2002/0033514 | A1 | * | 3/2002 | Sugawara et al. ........... 257/431 |
| 2002/0056474 | A1 | * | 5/2002 | Sugawara et al. ........... 136/261 |
| 2002/0117667 | A1 | * | 8/2002 | Sugawara et al. ............ 257/59 |
| 2002/0162585 | A1 | * | 11/2002 | Sugawara et al. ........... 136/250 |

* cited by examiner

*Primary Examiner*—Alan Diamond
(74) *Attorney, Agent, or Firm*—Hogan & Hartson, LLP

(57) ABSTRACT

In a photoelectric conversion device having numerous crystalline semiconductor grains deposited on a substrate, the substrate includes an aluminum layer or an aluminum alloy layer, an intermediate layer, and a base material layer, in which the intermediate layer is arranged such that it is composed mainly of one or a plurality of elements selected from among nickel, titanium, chromium, and cobalt. With the constitution as above, it is possible to suppress reaction between the aluminum electrode layer and the base material layer, thereby maintaining the high adhesiveness of the aluminum electrode layer. A photoelectric conversion device with high reliability and high conversion efficiency is therefore realized.

8 Claims, 3 Drawing Sheets

CRACK

CRACK

PHOTOELECTRIC CONVERSION DEVICE

This application is based on applications Nos. 2000-331415, 2001-020625, 2001-020626, and 2000-362019 filed in Japan, the content of which is incorporated hereinto by reference.

BACKGROUND OF THE INVENTION

1. Field of the Invention

The present invention relates to a photoelectric conversion device used for solar power generation.

2. Description of the Related Art

Photoelectric conversion devices using crystalline semiconductor particles have been known as prior art(Refer to U.S. Pat. No. 4,514,580 as an example).

In the above photoelectric conversion device using crystalline semiconductor particles, an aluminum electrode layer with a low melting point and large electric conductivity is used in the area where the substrate and the crystalline semiconductor particles are joined together. Accordingly, it is possible to accomplish low temperature joining and formation of a low resistance electrode. In addition, the device has another advantage when using p-type crystalline semiconductor particles that p+ regions can be formed in the junctions between the semiconductor particles and the aluminum electrode layer so that high conversion efficiency can be achieved.

However, in the arrangement described above, fusion bonding proceeds between the crystalline semiconductor particles and the aluminum electrode layer without restriction making it hard to control the joining.

As an effective joining-control means, there has been an idea that the fusion bonding is prevented from proceeding beyond the thickness of the aluminum electrode layer by disposing a metal layer that has a melting point higher than that of aluminum beneath the aluminum layer. This high melting point metal may be iron or stainless steel, which is optimum in terms of melting point, rigidity, thermal expansivity and cost performance.

The above U.S. Pat. No. 4,514,580 discloses an arrangement shown in FIG. 9 in which an aluminum film 12 is formed around a steel substrate 11, and crushed p-type silicon particles 13 are joined to the aluminum film 12, over which an insulator layer 16, a n-type silicon layer 14, and a transparent conductive layer 15 are formed in succession.

However, in the above arrangement, it is necessary to apply heat at a high temperature above 550° C. when joining the silicon and the aluminum together. In such a high temperature range, aluminum and iron react to each other so that an aluminum-iron alloy layer is generated in the interface between the aluminum and iron. Such an aluminum-iron layer is so hard that it tends to generate cracks, which causes the reliability of the photoelectric conversion device to drop.

The present invention intends to suppress the reaction between the aluminum electrode layer and the substrate so as to maintain the high adhesiveness of the aluminum electrode layer, thereby providing a photoelectric conversion device with high reliability.

Also, there has been a problem that when the aluminum electrode layer provided at the joint between the substrate and the crystalline semiconductor particles is too thin, it is likely to be oxidized and suffer corrosion when tested under a high temperature-high humidity environment resulting in lowered reliability.

In order to solve this problem, the aluminum electrode layer needs to be thickened. However, when the aluminum electrode layer is thickened, the particle sizes of the crystalline semiconductor particles to be joined need to be increased accordingly, which leads to the problem of lowering of the photoelectric conversion efficiency.

It is an object of this invention to suppress excessive reaction between the aluminum electrode layer serving as the substrate and the crystalline semiconductor particles and provide a low-cost photoelectric conversion device with high efficiency in which miniaturization of the silicon particles and thinning of the aluminum electrode layer can be accomplished.

BRIEF SUMMARY OF THE INVENTION (1) A photoelectric conversion device according to the present invention comprises a substrate having an electrode layer of one side, numerous crystalline semiconductor grains deposited on the substrate, an insulator formed among the crystalline semiconductor grains, and another electrode layer connected to the upper portions of the crystalline semiconductor grains. The substrate has a layered structure which includes: the electrode layer of one side, an intermediate layer and a base material layer. The electrode layer comprises an aluminum layer or an aluminum alloy layer. The intermediate layer comprises an alloy composed of one or a plurality of elements selected from among nickel, titanium, chromium, and cobalt(claim 1).

The structure above may be arranged such that the intermediate layer serves also as the base material layer(claim 2).

According to the above arrangement, it is possible to suppress the reaction between the aluminum electrode layer and the base material layer so as to maintain the high adhesiveness of the aluminum electrode layer. Accordingly, a photoelectric conversion device with high reliability and high conversion efficiency can be obtained.

(2) Another photoelectric conversion device according to the present invention comprises a substrate having an electrode of one side, numerous crystalline semiconductor grains deposited on the substrate, an insulator formed among the crystalline semiconductor grains, and another electrode layer connected to the upper portions of the crystalline semiconductor grains. The electrode layer of one side comprises an alloy composed of aluminum and silicon(claim 3).

According to this arrangement, it is possible to suppress excessive fusion bonding reaction between the aluminum electrode layer and the crystalline semiconductor grains so as to maintain the strength required for the substrate. Accordingly, it is possible to prevent corrosion from occurring on the surface of the substrate, thereby obtaining a photoelectric conversion device with high reliability and high conversion efficiency.

(3) Another photoelectric conversion device according to the present invention comprises a substrate having an electrode layer of one side, numerous crystalline semiconductor grains deposited on the substrate, an insulator formed among the crystalline semiconductor grains, and another electrode layer connected to the upper portions of the crystalline semiconductor grains. The electrode layer of one side comprises an alloy composed of aluminum and one or a plurality of elements selected from among magnesium, manganese, chromium, and titanium(claim 5).

Similarly to the case of (2) above, excessive fusion bonding reaction between the aluminum electrode layer and the crystalline semiconductor grains can be suppressed by this arrangement. Corrosion on the surface of the substrate can therefore be prevented from occurring, and as a result, a photoelectric conversion device with high reliability and high conversion efficiency can be obtained.

(4) Another photoelectric conversion device according to the present invention comprises a substrate having an electrode layer of one side, numerous crystalline semiconductor grains deposited on the substrate, an insulator formed among the crystalline semiconductor grains, and another electrode layer connected to the upper portions of the crystalline semiconductor grains. A junction between the crystalline semiconductor grains and the electrode layer of one side includes an alloy formed therein. The alloy is composed of the semiconductor of the crystalline semiconductor grains and a metal constituting the electrode layer of one side, and the alloy has particles of the semiconductor material of the crystalline semiconductor grains being dispersed therein (claim 6).

According to this arrangement, since the junctions comprise complexes including particles dispersed therein that comprise the material constituting the crystalline semiconductor grains, the thermal expansion coefficient of the complexes is an intermediate value between those of the crystalline semiconductor grains and the substrate, so that cracks due to stress caused by the difference in thermal expansion coefficient can be prevented from occurring in the junctions. Accordingly, the substrate and the crystalline semiconductor grains can be joined in a good condition.

Structural details of the present invention will be hereinafter described referring to the drawings.

DETAILED DESCRIPTION OF THE INVENTION

1. First Embodiment

Figure 1:
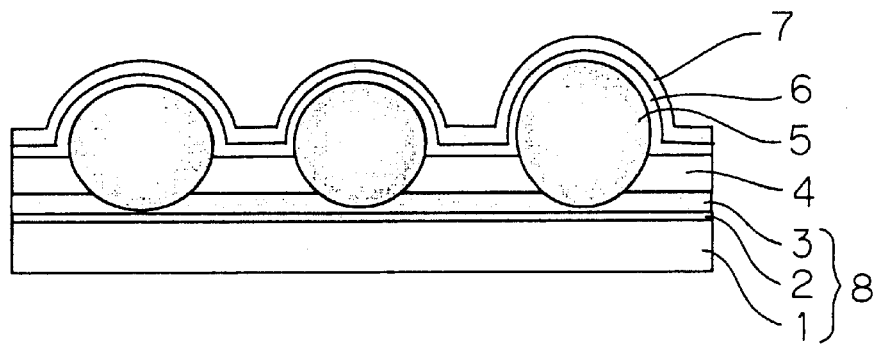
FIG. 1 is a cross-sectional view of a photoelectric conversion device according to a first embodiment of the present invention.

FIG. 1 is a cross-sectional view of a photoelectric conversion device according to a first embodiment of the present invention.

In FIG. 1, the numerals 1, 2, 3 denote a base material layer, an intermediate layer, and an aluminum alloy layer, respectively. The base material layer 1, the intermediate layer 2, and the aluminum alloy layer 3 constitute a substrate 8. It is also possible to form a bottom layer beneath the base material layer 1. A layer solely made of aluminum may be used instead of the aluminum alloy layer.

The material for the base material layer 1 may be any metal as long as it has a melting point higher than that of aluminum, and may be any one or an alloy of metals including iron, nickel, titanium, chromium, cobalt, copper, silver, niobium, molybdenum, tantalum, tungsten, and platinum.

The intermediate layer 2 may also be an alloy composed mainly of nickel, titanium, chromium, or cobalt. A similar effect was obtained when the intermediate layer 2 was an alloy in which oxide, nitride, carbon, iron, copper, aluminum, niobium, molybdenum, tantalum, or tungsten was added to the above alloy by 30% or so. The intermediate layer 2 exhibits only a little reaction even when heated at a temperature where the crystalline semiconductor grains and the aluminum 3 are fusion bonded. The intermediate layer 2 is thin and rigid, the high adhesiveness can be maintained.

The film thickness of the intermediate layer 2 is preferably 0.5 μm or more. When it is below 0.5 μm, the intermediate layer 2 may be broken in some areas, where the base material layer 1 and the aluminum alloy layer 3 react to each other causing cracking, breaking, or peeling. Such a thin film thickness is therefore unfavorable. When the intermediate layer 2 comprises nickel, titanium, chromium, or cobalt, there is no upper limit to the film thickness, and it may be used as the base material layer as it is (See FIG. 2).

The aluminum alloy layer 3 joins to the crystalline semiconductor grains 5 allowing for low-temperature joining and formation of a low-resistance electrode. The thickness of the aluminum alloy layer 3 is preferably neither less than 5 μm nor more than ½ of the average grain size of the crystalline semiconductor grains. At film thicknesses less than 5 μm, its joining to the crystalline semiconductor grains 5 is inadequate, and the junctions become too large at film thicknesses more than ½ of the average grain size of the crystalline semiconductor grains 5. Such film thicknesses are therefore unfavorable. With the crystalline semiconductor grains 5 being p-type, the aluminum alloy layer 3 can form p+ regions in the junctions so that a high conversion efficiency can be achieved.

Clearances among the crystalline semiconductor grains are filled with the insulator 4. The insulator 4 comprises an insulating material for separating the positive electrode from the negative electrode. The insulator may comprise, for example, glass slurry composed of components arbitrarily selected from among $SiO_2$, $Al_2O_3$, PbO, $B_2O_3$, ZnO and the like. The insulator 4 is formed over the aluminum alloy layer 3 and needs to have some degree of hardness or viscosity so as to temporarily hold the crystalline semiconductor grains 5 pressed thereinto. In addition, the insulator 4 needs to have a characteristic capable of partly covering the crystalline semiconductor grains 5 (exposing the upper halves of the crystalline semiconductor grains) by melting at a temperature of heat applied thereto for creating an ohmic contact between the aluminum alloy layer 3 and the crystalline semiconductor grains 5.

The first conductive-type crystalline semiconductor grains 5 comprise Si, Ge, and a small amount of p-type impurity such as B, Al, Ga, or n-type impurity such as P, As. The shapes of the crystalline semiconductor grains 5 may be polygons or shapes having curved surfaces. Preferably, they should comprise curved surfaces, especially spherical shapes so that they efficiently push the insulator layer 4 aside when pressed from above the insulator layer 4 so as to come into contact with the aluminum alloy layer 3.

The grain sizes of the crystalline semiconductor grains 5 may be even or uneven. However, uneven grain sizes will be advantageous to get them more economically, because an additional process is necessary in order to uniformize the grain sizes. Incidentally, the crystalline semiconductor grains 5 will be brought into sufficient contact with the aluminum alloy layer 3 even when the grain sizes are uneven by using a pressing jig made of a flexible material when pressing the crystalline semiconductor grains 5 from above the insulator layer 4 so as to bring them into contact with the aluminum alloy layer 3. Furthermore, the crystalline semiconductor grains 5 will contribute to reducing dependence on the light incidence angle by having convex surfaces.

A second conductivity-type semiconductor layer 6 is formed by the vapor-phase growth method, in which, for example, a vapor-phase phosphorous system compound that is a n-type impurity or a vapor-phase boron system compound that is a p-type impurity is added in a small amount to a vapor-phase silane compound. In addition, it is also possible to introduce phosphorous that is a n-type impurity or boron that is a p-type impurity into the crystalline semiconductor grains 5 by the thermal diffusion method or ion implantation.

Meanwhile, the crystalline semiconductor layer 6 may comprise a single crystal, polycrystalline or microcrystalline semiconductor. Since the crystalline semiconductor layer 6 also serves as an electrode, it is not necessary to additionally form a transparent conductive film. The manufacturing process is thus simplified allowing further cost reduction. In addition, in a case where a transparent conductive film is formed as an electrode on defective portions generated during the formation of the crystalline semiconductor layer 6, leakage will occur between the transparent conductive film and the crystalline semiconductor grains 5 located under the defective portions, which is a problem.

The concentration of the microelement inside the crystalline semiconductor layer 6 may be, for example, from $1 \times 10^{16}$ to $1 \times 10^{21}$ atm/cm$^3$.

A protective film 7 is formed over the second conductivity-type semiconductor layer 6. The protective film 7 preferably has the characteristics of a dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the second conductivity-type semiconductor layer 6. Transparency is necessary for the protective film 7, because it is in contact with the surface where the light is incident. The protective film 7 needs to be a dielectric in order to insulate and protect the semiconductor portion. Incidentally, optimizing the thickness of the protective film 7 will enable it to serve as an anti-reflection film.

Moreover, it is also possible to provide a patterned electrode comprising fingers and bus bars at regular intervals on the second conductivity-type crystalline semiconductor layer 6 or on the protective film 7 so as to lower the series resistance of the electrode, thereby improving the conversion efficiency of the photoelectric conversion device.

EXAMPLE 1

First, as shown in FIG. 1, a substrate 8 with a trilaminar structure consisting of a base material layer 1, an intermediate layer 2 and an aluminum layer 3 was formed in which stainless steel, the material for the intermediate layer and aluminum were rolled at room temperature and bonded together. The thicknesses of the stainless steel, intermediate layer and the aluminum were 2000 µm, 5 µm and 50 µm, respectively.

As the material for the intermediate layer 2, titanium, nickel, chromium, cobalt, iron and copper were used. Also, a sample without the intermediate layer was fabricated. Evaluation was carried out on the samples with the intermediate layer and that without the intermediate layer, in which the material for the intermediate layer was varied. The result of the evaluation of these samples is shown in Table 1-1.

An insulator layer was formed over the substrate 8. Glass paste was used for forming the insulator layer of 50 µm in thickness on the substrate 8. The glass used for the glass paste was one whose softening temperature is 500° C.

Subsequently, p-type silicon grains whose average grain size was 150 µm were densely deposited on the insulator layer. Then they were heated at 600° C. so that the silicon grains were sunk into the insulator layer until they came into contact with the aluminum layer. By this heating, the grass paste was fired so as to form the insulator layer, as well as the aluminum and the silicon grains were fusion-bonded.

Subsequently, a n-type crystalline silicon layer was formed 400 nm thick over the silicon grains and the insulating layer, on which a silicon nitride film was further formed 500 nm thick as a protective film.

The reliability was evaluated after exposing each sample to a 85° C., 95% RH atmosphere for 2000 hours. The surface and a cross-section of each sample were observed. Samples that suffered peeling and breaking are marked by ×, samples that had no peeling or breaking but had partial cracking are marked by Δ, samples with no peeling, breaking or cracking are marked by ○.

TABLE 1-1

|  | Material for intermediate layer | Reliability |
| --- | --- | --- |
| Example 1 | Titanium | ○ |
| Example 2 | Nickel | ○ |
| Example 3 | Chromium | ○ |
| Example 4 | Cobalt | ○ |
| Comparative example 1 | None | X |
| Comparative example 2 | Iron | Δ |
| Comparative example 3 | Copper | Δ |

As is apparent from the above result, the reliability was good when titanium, nickel, chromium, or cobalt was used for the intermediate layer.

Subsequently, the reliability was evaluated after the thickness of the intermediate layer was varied, the result of which is shown in Table 1-2. Copper, titanium, aluminum were rolled at room temperature and bonded together so as to form a substrate. The thicknesses of the copper and aluminum were 5000 µm and 30 µm, respectively. The thickness of the titanium was varied and the resultant samples were evaluated.

TABLE 1-2

|  | Thickness of titanium intermediate layer (µm) | Reliability |
| --- | --- | --- |
| Example 1 | 0.5 | ○ |
| Example 2 | 1.0 | ○ |

TABLE 1-2-continued

| | Thickness of titanium intermediate layer (μm) | Reliability |
|---|---|---|
| Example 3 | 10.0 | ○ |
| Example 4 | 100.0 | ○ |
| Comparative example 1 | None | X |
| Comparative example 2 | 0.1 | X |
| Comparative example 3 | 0.3 | Δ |

The above result explains that the reliability was good when the thickness of the intermediate layer was 0.5 μm or more.

Figure 2:
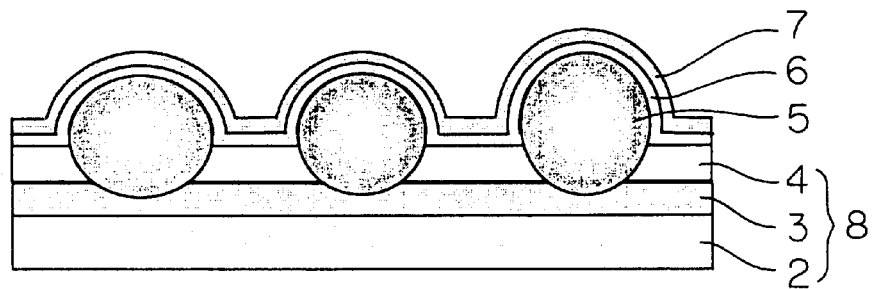
FIG. 2 is a cross-sectional view of a photoelectric conversion device according to the first embodiment of the present invention.

Subsequently, two-layer substrates each of which consisted of a base material layer 2 and an aluminum layer 3 in FIG. 2 were formed. A base material layer and an aluminum-silicon alloy were rolled at room temperature and bonded together so as to form the substrate. The thicknesses of the base material layer and the aluminum-silicon alloy layer were 3000 μm and 100 μm, respectively. The material for the base material layer was varied and resultant samples were evaluated, the result of which is shown in Table 1-3.

TABLE 1-3

| | Material for base material layer | Reliability |
|---|---|---|
| Example 5 | Titanium | ○ |
| Example 6 | Nickel | ○ |
| Example 7 | Chromium | ○ |
| Example 8 | Cobalt | ○ |
| Comparative example 4 | Iron | Δ |
| Comparative example 5 | Tin | X |
| Comparative example 6 | Stainless steel | Δ |

As is apparent from the above result, the reliability is good when titanium, nickel, chromium, or cobalt was used for the base material layer.

2. Second Embodiment

A second embodiment of this invention is hereinafter discussed.

Figure 3:
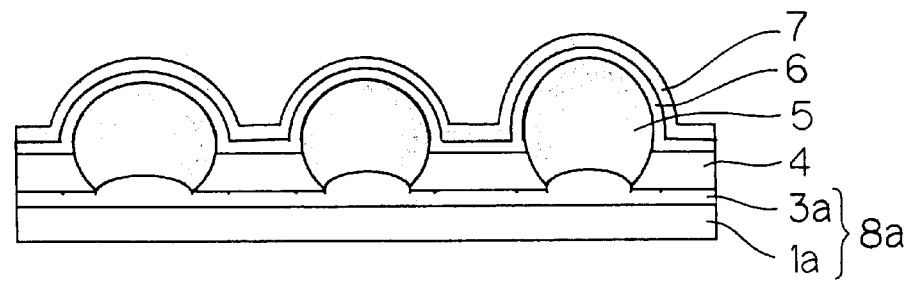
FIG. 3 is a cross-sectional view of a photoelectric conversion device according to a second embodiment of the present invention.

FIG. 3 is a cross-sectional view of a photoelectric conversion device according to the second embodiment of this invention.

In FIG. 3, parts denoted by the same numerals as those in the embodiment in FIG. 1 comprise the same respective materials. Explanation of them is therefore not repeated here.

The part denoted by 1a is a base material layer, and the part denoted by 3a is an electrode layer. The part combining 1a and 3a is referred to as a substrate 8a.

The base material layer 1a may be a metal with a melting point equal to or higher than that of aluminum or ceramics. For example, a material such as aluminum, an aluminum alloy, iron, stainless steel, nickel, or alumina is used.

The electrode layer 3a comprises an alloy composed of aluminum and silicon. The use of the alloy composed of aluminum and silicon prevents the crystalline semiconductor grains 5 from overly melting when joined to the electrode layer 3a. This arrangement is effective especially when the grain sizes of the crystalline semiconductor grains 5 are lessened to 0.2–0.6 mm in order to reduce the amount of silicon usage.

Incidentally, the amount of silicon to be contained in the electrode layer 3a is preferably in the range of 1.5–30 wt %.

Proportions of the silicon addition under 1.5 wt % are inadequate for preventing the excessive melting, and those over 30 wt % make the aluminum alloy brittle drastically dropping its strength, and therefore they are unfavorable for the formation of an electrode. In addition, it is possible to maintain the ability to prevent the excessive melting by adding one or a plurality of elements selected from among magnesium, manganese, chromium, titanium, nickel, zinc, silver, and copper together with silicon.

The film thickness of the electrode layer 3a should be 20 μm or more. When it is below 20 μm, the shortage of thickness makes it impossible to perform sufficient joining between the electrode layer and the crystalline semiconductor grains 5.

Figure 4:
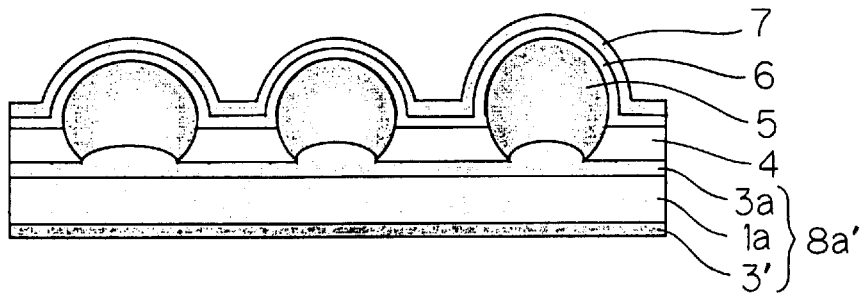
FIG. 4 is a cross-sectional view of a photoelectric conversion device according to the second embodiment of the present invention.

Incidentally, when metal is used for the base material layer 1a, an aluminum alloy layer 3' may be formed on the surface opposite to the surface on the side of the electrode layer 3a (See FIG. 4.) so as to enhance the reliability of the backside.

During the manufacture of the photoelectric conversion device, the silicon diffuses from the crystalline semiconductor grains 5 into the electrode layer 3a comprising an alloy composed of aluminum and silicon so that additional aluminum-silicon alloy portions are formed.

An insulator 4 is formed over the substrate 8a. Numerous first conductive-type crystalline semiconductor grains 5 are deposited on the insulator 4.

The grain sizes of the crystalline semiconductor grains 5 are preferably in the range of 0.2–0.8 mm. Using semiconductor grains with diameters over 0.8 mm fails to make a difference in silicon usage from the amount of silicon including that in the cut off portions used in conventional crystal plate-type photoelectric conversion devices. This nullifies the advantage of the use of crystalline semiconductor grains 5. On the other hand, when the grain sizes are smaller than 0.2 mm, it is hard to apply them on the substrate 8a'. More desirably, the range should be 0.2–0.6 mm in view of minimal silicon usage.

A second conductivity-type crystalline semiconductor layer 6 serving also as the surface electrode is formed over the insulator layer 4 and the crystalline semiconductor grains 5. A protective film 7 is formed on the second conductivity-type crystalline semiconductor layer 6.

EXAMPLE 2

As shown in Table 2, substrates were made such that each of the substrates was formed by forming a 50 μm thick aluminum alloy on a stainless steel base material layer by cold pressure welding, in which the silicon content of the aluminum alloy was varied from substrate to substrate. Glass paste was applied on the substrate so as to form a 100 μm thick insulator layer. The glass used for the glass paste had a softening temperature of around 400° C. P-type silicon grains having grain sizes around 0.2–0.6 mm were deposited on and pressed into the insulator layer so that they came into contact with the aluminum alloy. Then, they were heated at 577° C. for 5–10 minutes so as to join the silicon grains to the aluminum alloy. A n-type crystalline silicon layer was formed 400 μm over the silicon grains and the insulator layer, on which a protective film comprising silicon nitride was further formed.

Five samples were prepared for each case. The silicon contents of the aluminum alloys and the appearances of the silicon grains are shown in Table 2.

TABLE 2

|  | Silicone grain size (mm) | Silicon content in the aluminum alloy (wt %) | Frequency of complete melting of silicon grains |
|---|---|---|---|
| Example 11 | 0.2 | 1.6 | 0/5 |
| Example 12 | 0.2 | 5.2 | 0/5 |
| Example 13 | 0.2 | 11.1 | 0/5 |
| Example 14 | 0.2 | 29.6 | 0/5 |
| Example 15 | 0.6 | 1.6 | 0/5 |
| Comparative example 11 | 0.2 | 0.0 | 3/5 |
| Comparative example 12 | 0.2 | 1.2 | 2/5 |
| Comparative example 13 | 0.6 | 1.2 | 1/5 |
| Comparative example 14 | 0.2 | 32.8 | — |

In the comparative examples 11 to 13, there was a case where three out of the five samples had the silicon grains completely melted. This indicates that the reliability in terms of manufacturing stability is low when the silicon content of the aluminum alloy is lower than 1.5%. In the comparative example 14, the silicon content of the aluminum alloy was too high resulting in a brittle aluminum alloy, which made it impossible to form the aluminum alloy layer on the stainless steel base material layer in the process of forming the substrate.

On the other hand, in the examples 11–15, no problem occurred in the formation of the substrates or the melting conditions of the silicon grains, so that good photoelectric conversion devices were obtained. Consequently, it is considered that silicon grains can be prevented from excessively melting and the strength of the substrate in its initial state can be maintained as long as the silicon content of the aluminum alloy is approximately in the range of 1.5–30%. It has been verified by these examples that the present invention can be embodied in photoelectric conversion devices with high reliability.

3. Third Embodiment

A third embodiment of the present invention is now described.

Figure 5:
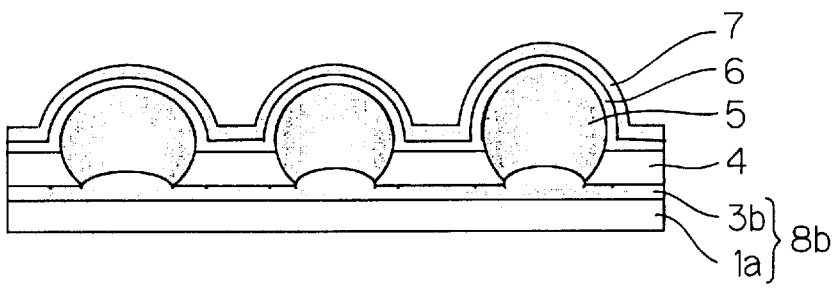
FIG. 5 is a cross-sectional view of a photoelectric conversion device according to a third embodiment of the present invention.

FIG. 5 is a cross-sectional view of a photoelectric conversion device according to the third embodiment of this invention. In the third embodiment, only the composition of the electrode layer is different from that of the second embodiment, and other features are equivalent to those in the second embodiment. The modified feature is hereinafter described.

In FIG. 5, a substrate 8b consists of a base material layer 1a and an electrode layer 3b. The electrode layer 3b shown in FIG. 5 comprises an alloy composed of aluminum and one or a plurality of elements selected from among magnesium, manganese, chromium and titanium. By using the aluminum alloy including such elements added thereto, high corrosion resistance leading to high reliability can be achieved. Accordingly, light energy entering from above is reflected from the surface of the electrode layer 3b, and the reflected light irradiates the crystalline semiconductor grains 5 adjacent to the electrode layer 3b, thereby preventing the photoelectric conversion efficiency from dropping.

The proportions of the one or a plurality of elements selected from among magnesium, manganese, chromium and titanium to be added to aluminum are around 0.5 to several ten %. Proportions under 0.5% are inadequate to improve the reliability, and at proportions over 20%, the electric conductivity of the aluminum sharply drops.

Furthermore, it is possible to maintain the reliability also by further adding one or a plurality of elements selected from among silicon, nickel, zinc, silver, and copper so as to enhance various properties.

The film thickness of the electrode layer 3b should be 20 $\mu$m or more. When the film thickness is less than 20 $\mu$m, it is too thin for the electrode layer to adequately join to the crystalline semiconductor grains.

EXAMPLE 3

Various aluminum alloys shown in Table 3 were formed on stainless steel base material layers so as to form substrates.

Glass paste was used to form a 100 $\mu$m thick insulator layer on each of the substrates. The glass used for the glass paste had a softening temperature of around 400° C. On the insulator layer, p-type silicon grains with grain sizes of approximately 800 $\mu$m were deposited and pressed so that they came into contact with the aluminum alloy. Then, they were heated at a temperature in the vicinity of 577° C. so as to join the silicon grains to the aluminum alloy. A n-type crystalline silicon layer was formed to be 400 $\mu$m thick over the silicon grains and the insulator layer, on which a protective film comprising silicon nitride was further formed. The proportions of various elements added to aluminum were approximately in the range of 0.5 to several ten %.

Samples prepared through the steps as above were tested under a 85° C. and 85% RH environment for 2000 hours. The photoelectric conversion efficiencies evaluated before and after the environmental test are shown in Table 3.

TABLE 3

|  | First additive element in Al | Second additive element in Al | Photoelectric conversion efficiency (%) | |
|---|---|---|---|---|
|  |  |  | Before environmental test | After environmental test |
| Example 21 | Mg | None | 10.8 | 0.0 |
| Example 22 | Mn | None | 10.6 | 0.0 |
| Example 23 | Cr | None | 10.7 | 0.0 |
| Example 24 | Ti | None | 10.7 | 0.1 |
| Example 25 | Mg | Zn | 10.7 | 0.1 |
| Example 26 | Mg | Ag | 10.6 | 0.1 |
| Example 27 | Mg | Cu | 10.8 | 0.1 |
| Example 28 | Mg | Ni | 10.8 | 0.1 |
| Example 29 | Mn | Ni | 10.7 | 0.0 |
| Example 30 | Mn | Si | 10.7 | 0.1 |
| Comparative example 21 | None | None | 10.8 | 0.4 |
| Comparative example 22 | Fe | None | 10.7 | 0.7 |
| Comparative example 23 | Cu | None | 10.9 | 0.6 |
| Comparative example 24 | Zn | None | 10.6 | 0.5 |
| Comparative example 25 | Ag | None | 10.9 | 0.5 |

In the comparative examples 21–25, the surfaces of the aluminum alloy layers were slightly clouded and the conversion efficiencies dropped after the environmental test. This may be explained that the surfaces of the aluminum alloy layers corroded due to the environmental test, by which the quantity of the light reflected from the aluminum alloy layers decreased.

On the other hand, in the examples 21–24, no defects such as clouding were observed in the surfaces of the aluminum alloy layers after the environment test, and there were no decreases in conversion efficiency. This may be explained that the added elements contributed to attaining corrosion resistance.

In addition, in the examples 25–30 where two kinds of elements were added to aluminum in each case, no decreases in conversion efficiency were observed as in the examples 21–24. This may be explained that even the elements that caused deterioration in the comparative examples contributed to attaining corrosion resistance as a result of combining them with the elements used in the examples 21–24.

It has been verified from the above results that the present invention can be embodied in photoelectric conversion devices with high reliability in which good conversion efficiency is maintained.

4. Fourth Embodiment

A fourth embodiment of the present invention is now discussed.

Figure 6:
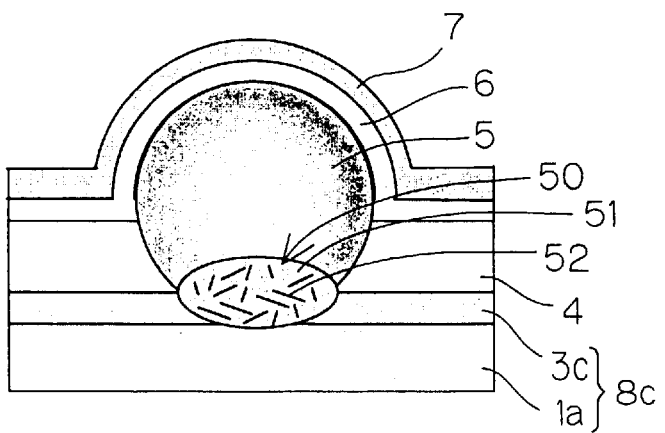
FIG. 6 is a cross-sectional view of a photoelectric conversion device according to a fourth embodiment of the present invention.

FIG. 6 is a cross-sectional view of a photoelectric conversion device according to the fourth embodiment of the present invention. When compared with the second and third embodiments (FIGS. 3–5), this fourth embodiment is characterized in the composition of the junctions between the electrode layer 3a and the crystalline semiconductor grains 5. The feature that differs from the second embodiment (FIG. 3) is hereinafter described.

In FIG. 6, a substrate 8c consists of a base material layer 1a and an electrode layer 3c. The base material layer 1a may comprise a metal with a melting point higher than that of aluminum, ceramics or resin. For example, it may be aluminum, an aluminum alloy, iron, stainless steel, nickel, or alumina. The electrode layer 3c comprises aluminum or an aluminum alloy. When the base material layer 1a comprises aluminum or an aluminum alloy, it can serve also as an electrode layer.

The part denoted by 50 is a complex generated in the junction between the substrate 8c and a crystalline semiconductor grain 5.

The crystalline semiconductor grains 5 comprise Si, Ge, and a small amount of p-type impurity such as B, Al, Ga, or n-type impurity such as P, As added thereto. The crystalline semiconductor grains 5 are not limited to the single-layer type mentioned above, but may be a two-layer type arranged such that when the crystalline semiconductor grains 5 are p-type, each of the grains has a surface layer comprising Si, Ge and n-type impurity such as P and As, and when the crystalline semiconductor grains 5 are n-type, each of the grains has a surface layer comprising Si, Ge, and a p-type impurity such as B, Al and Ga.

As shown in FIG. 6, the complex 50 comprises an alloy 51 composed of materials constituting the crystalline semiconductor grain 5 and the substrate 8c, and particles 52 dispersed in the alloy 51 that comprise the material constituting the crystalline semiconductor grain 5. The crystalline semiconductor grain 5 is joined to the substrate 8c through the complex 50.

Since the complex 50 includes the particles 52 dispersed therein comprising the material constituting the crystalline semiconductor grain 5, its thermal expansion coefficient is an intermediate value between those of the crystalline semiconductor grain 5 and the substrate 8c. Accordingly, cracking due to the difference in thermal expansion coefficient between the materials does not occur when the temperature is brought down from the junction temperature to a room temperature, so that good joining can be accomplished between the crystalline semiconductor grain 5 and the substrate 8c.

This embodiment is hereinafter described referring to a case where the crystalline semiconductor grains 5 comprise silicon, and the substrate 8c or the electrode layer 3c comprises aluminum.

In order to form the complexes 50 between the crystalline semiconductor grains 5 and the substrate 8c, heat treatment is applied with the crystalline semiconductor grains 5 and the substrate 8c being in contact with each other at a temperature higher than 577° C., which is the eutectic temperature of aluminum and silicon. The complexes 50 are thus formed between the crystalline semiconductor grains 5 and the substrate 8c.

When the formation of junctions between the crystalline semiconductor grains 5 and the substrate 8c by interdiffusion is simply aimed at, it can be accomplished by keeping them at a temperature below the eutectic point 577° C., for instance, 400° C., while having them being in contact with each other. However, due to the great difference in thermal expansion coefficient between silicon ($28 \times 10^{-7}$/° C. and aluminum ($236 \times 10^{-7}$/°C.), cracking occurs at the interfaces between the crystalline semiconductor grains 5 and the substrate 8c when the temperature is brought down to a room temperature. Furthermore, even when silumin (AlSi$_{12}$ with a thermal expansion coefficient of $204 \times 10^{-7}$/° C.) is interposed between the crystalline semiconductor grains 5 and the substrate 8c and joining is carried out, the great difference in thermal expansion coefficient between silumin and the crystalline semiconductor grains 5 causes cracking at the interface between the silumin and the aluminum when the temperature is brought down to a room temperature.

EXAMPLE 4

Three samples were prepared as an example 31 and comparative examples 31, 32.

A cross-sectional view of the sample of the example 31 is shown in FIG. 6. An aluminum layer 3c was formed 50 μm on a base material layer 1a including iron to which an insulator 4 was applied and formed thereon such that it had a thickness close to one half of the grain sizes of crystalline semiconductor grains 5 after firing. For the insulator 4, glass particles of the $SiO_2$—$B_2O_3$—PbO system were used being mixed with a binder and a solvent. P-type silicon grains 5 were densely deposited on the insulator 4 and pressed thereinto so as to be brought into contact with the aluminum layer 3c. Subsequently, with pressure being applied, firing was carried out at a temperature above 577° C. so as to melt the insulator 4 and join the crystalline semiconductor grains 5 to the aluminum layer 3c. Then they were gradually cooled at a temperature gradient of approximately 0.5–50° C./min to 500° C.

In the comparative example 31, as in the example 31, p-type silicon grains 5 were densely deposited on and pressed into the insulator 4 so as to be brought into contact with the aluminum layer 3c. Then, firing was carried out at 400° C. so as to melt the insulator 4 and join the crystalline semiconductor grains 5 to the aluminum layer 3c by interdiffusion. Then cooling was carried out gradually in the same way as the example 31.

Figure 8:
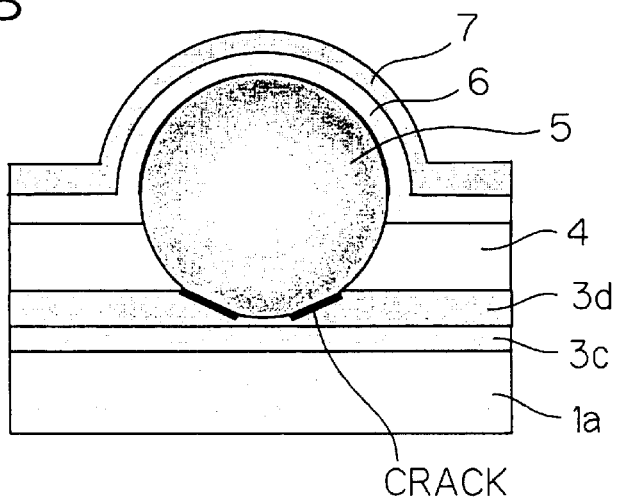
FIG. 8 is a cross-sectional view of a photoelectric conversion device according to the fourth embodiment of the present invention.
Figure 9:
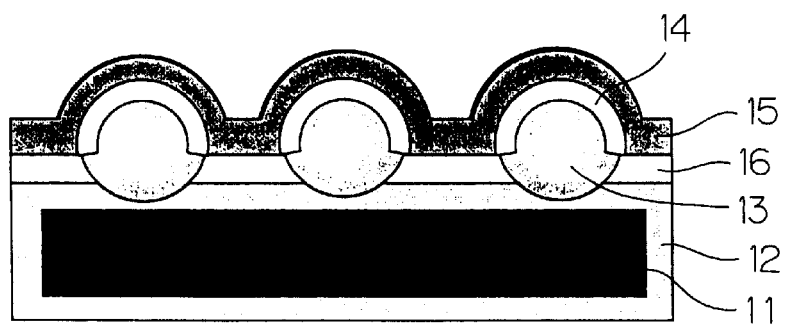
FIG. 9 is a cross-sectional view of a conventional photoelectric conversion device.

In the comparative example 32, a substrate consisting of a base material layer 1a including iron, a 50 μm thick aluminum layer 3c formed thereon, and a 50 μm thick silumin layer 3d further formed thereon was used (FIG. 8). In the same way as the example 31, firing was carried out at a temperature above 577° C., and then rapid cooling was performed at a temperature gradient of 100° C./min to 500° C.

The joining condition between the silicon grains 5 and the aluminum layer 3c was checked out on each of the above samples, the result of which is shown in Table 4.

Figure 7:
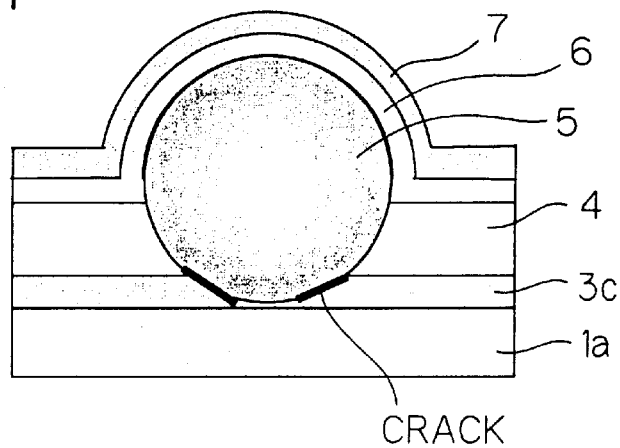
FIG. 7 is a cross-sectional view of a photoelectric conversion device according to the fourth embodiment of the present invention.

In the comparative example 31, it was unable to obtain good joining due to the cracking occurred between the p-type silicon grains 5 and the substrate (FIG. 7). Observation of the junctions revealed that silicon-aluminum alloy portions were not formed and cracking was generated between the p-type silicon grains 5 and the substrate. The cause of the cracking may be attributed to the difference in thermal expansion coefficient between the p-type silicon grains 5 and the substrate.

Also in the comparative example 32, good joining was not obtained due to cracking between the p-type silicon grains 5 and the substrate (FIG. 8). Observation of the junctions revealed that although the silicon-aluminum alloy melted between the p-type silicon grains 5 and the substrate, cracks were generated at the interfaces between the p-type silicon grains 5 and the silicon-aluminum alloy, and no silicon particles were observed in the alloy. The cause of the cracking may be attributed to stress due to the difference in thermal expansion coefficient between the p-type silicon grains 5 and the alloy.

On the other hand, the example 31 did not suffer cracking between the p-type silicon grains 5 and the substrate and exhibited a good joining condition. As shown in FIG. 6, the junctions between the p-type silicon grains 5 and the substrate had silicon-aluminum alloy portions 51 formed therein, and in the alloy portions, the complexes 50 in which the silicon was dispersed in the form of whisker-like particles 52 were observed.

The good joining condition of this example may be explained that due to the presence of the complexes 50 in which the silicon is dispersed in the form of whisker-like particles 52 in the silicon-aluminum alloy portions 51, the thermal expansion coefficient is lessened by the dispersion of the whisker-like silicon particles and smaller than that in the case of the alloy portions including only the silicon-aluminum alloy, so that stress due to the difference in thermal expansion coefficient has been reduced.

Incidentally, the effect was the same when a substrate solely including aluminum was used.

TABLE 4

| Sample | Cracking | Spot where cracking occurred |
| --- | --- | --- |
| Example 31 | Not found | — |
| Comparative example 31 | Found | Interface between silicon grain 5 and substrate |
| Comparative example 32 | Found | Interface between silicon grain 5 and alloy portion |

What is claimed is:

1. A photoelectric conversion device comprising a substrate having an electrode layer on one side, numerous crystalline semiconductor grains deposited on the substrate, an insulator formed among the crystalline semiconductor grains, and another electrode layer connected to upper portions of the crystalline semiconductor grains, wherein the substrate comprises:

the electrode layer on one side, an intermediate layer, and a base material layer, the electrode layer comprising an aluminum layer or an aluminum alloy layer;

the intermediate layer comprising an alloy composed of one or a plurality of elements selected from the group consisting of nickel, titanium, chromium, and cobalt.

2. A photoelectric conversion device comprising a substrate having an electrode layer on one side, numerous crystalline semiconductor grains deposited on the substrate, an insulator formed among the crystalline semiconductor grains, and another electrode layer connected to upper portions of the crystalline semiconductor grains, wherein the substrate comprises:

the electrode layer on one side and a base material layer, the electrode layer comprising an aluminum layer or an aluminum alloy layer; and the base material layer comprising an alloy composed of one or a plurality of elements selected from the group consisting of nickel, titanium, chromium, and cobalt.

3. A photoelectric conversion device comprising a substrate having an electrode on one side, numerous silicon crystalline semiconductor grains deposited on the substrate, an insulator formed among the crystalline semiconductor grains, and another electrode layer connected to upper portions of the crystalline semiconductor grains, wherein the contact of the silicon crystalline semiconductor grains with the electrode of the substrate is realized by (a) preparing the electrode layer of an alloy composed of aluminum and silicon, (b) depositing the silicon crystalline semiconductor grains on the electrode layer of the alloy composed of aluminum and silicon, and (c) heating so as to join the silicon grains to the electrode layer.

4. The photoelectric conversion device according to claim 3, wherein the electrode layer on one side has a silicon content of 1.5–30% by weight.

5. A photoelectric conversion device comprising a substrate having an electrode layer on one side, numerous crystalline semiconductor grains deposited on the substrate, an insulator formed among the crystalline semiconductor grains, and another electrode layer connected to upper portions of the crystalline on semiconductor grains, wherein the electrode layer on one side comprises an alloy composed of aluminum and one or a plurality of elements selected from the group consisting of magnesium, manganese, chromium, and titanium.

6. A photoelectric conversion device comprising a substrate having an electrode layer on one side, numerous crystalline semiconductor grains deposited on the substrate, an insulator formed among the crystalline semiconductor grains, Land another electrode layer connected to upper portions of the crystalline semiconductor pains, wherein a junction between the crystalline semiconductor rains and the electrode layer on one side comprises an alloy formed therein, the alloy being composed of the semiconductor of the crystalline semiconductor grains and a metal constituting the electrode layer on one side, and the alloy has particles of the semiconductor material of the crystalline semiconductor grains dispersed therein.

7. The photoelectric conversion device according to claim 6, wherein the electrode layer on one side comprises aluminum, and the crystalline semiconductor grains comprise silicon.

8. The photoelectric conversion device according to claim 7, wherein the junction between the crystalline semiconductor grains and the electrode layer on one side is formed by heating at 577° C. or higher with the crystalline semiconductor rains and the substrate being in contact with each other.

\* \* \* \* \*